US006818555B2

(12) United States Patent
Tsai et al.

(10) Patent No.: US 6,818,555 B2
(45) Date of Patent: Nov. 16, 2004

(54) METHOD FOR METAL ETCHBACK WITH SELF ALIGNED ETCHING MASK

(75) Inventors: How-Cheng Tsai, Kaohsiung (TW); Hung-Hsin Liu, Hsinchu (TW); Chung-Daw Young, Hsinchu (TW); Ming-Kuo Yu, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/266,177

(22) Filed: Oct. 7, 2002

(65) Prior Publication Data

US 2004/0067633 A1 Apr. 8, 2004

(51) Int. Cl.⁷ .................. H01L 21/44; H01L 21/4763
(52) U.S. Cl. .............. 438/672; 438/626; 438/628; 438/631; 438/644; 438/645; 438/648
(58) Field of Search .................. 438/672, 622, 438/626, 628, 629, 631, 644, 645, 648, 669, 637, 640

(56) References Cited

U.S. PATENT DOCUMENTS

| | | | | |
|---|---|---|---|---|
| 4,775,550 A | * | 10/1988 | Chu et al. ................. | 438/631 |
| 4,894,351 A | * | 1/1990 | Batty ...................... | 438/624 |
| 5,256,248 A | * | 10/1993 | Jun ......................... | 438/703 |
| 5,350,486 A | * | 9/1994 | Huang ..................... | 438/631 |
| 5,378,318 A | * | 1/1995 | Weling et al. ............. | 438/697 |
| 5,461,010 A | * | 10/1995 | Chen et al. ............... | 438/699 |
| 5,639,345 A | * | 6/1997 | Huang et al. ............. | 438/699 |
| 5,753,547 A | * | 5/1998 | Ying ....................... | 438/253 |
| 5,792,705 A | * | 8/1998 | Wang et al. .............. | 438/624 |
| 5,814,186 A | * | 9/1998 | Nguyen ................... | 438/703 |
| 5,930,677 A | * | 7/1999 | Zheng et al. ............. | 438/782 |
| 5,968,847 A | * | 10/1999 | Ye et al. ................... | 438/734 |
| 6,008,105 A | * | 12/1999 | Ukeda et al. ............. | 438/424 |
| 6,121,136 A | * | 9/2000 | Sung ....................... | 438/672 |
| 6,180,511 B1 | * | 1/2001 | Kim et al. ................ | 438/626 |
| 6,218,291 B1 | * | 4/2001 | Yoon et al. ............... | 438/634 |
| 6,265,315 B1 | * | 7/2001 | Lee et al. ................. | 438/692 |
| 6,391,781 B1 | * | 5/2002 | Ozawa et al. ............ | 438/692 |

FOREIGN PATENT DOCUMENTS

JP  2000-260868  * 9/2000 ......... H01L/21/768

* cited by examiner

Primary Examiner—M. Wilczewski
(74) Attorney, Agent, or Firm—Tung & Associates

(57) ABSTRACT

A method for a metal etchback process to form a metal filled semiconductor feature having improved planarity and electrical resistance including a semiconductor wafer having an etched opening lined with a refractory metal containing layer and a blanket deposited metal layer filling the etched opening; spin coating a spin on layer selected from the group consisting of an organic resinous layer and a spin-on glass layer over the metal layer; dry etching in a first etchback process to remove a first portion of the SOL layer to reveal a portion of the metal layer leaving a second portion of the SOL layer overlying the etched opening; dry etching in a second etchback process to remove the metal layer to reveal a portion of the refractory metal containing layer; and, removing the second portion of the SOL layer to form a substantially planar metal filled etched opening.

19 Claims, 2 Drawing Sheets

METHOD FOR METAL ETCHBACK WITH SELF ALIGNED ETCHING MASK

FIELD OF THE INVENTION

This invention generally relates to semiconductor processing methods including metallization processes and more particularly to metal filling of semiconductor features, including those with relatively wide opening dimensions, together with a metal etchback process including a self aligned etching mask to achieve planarization without the necessity of chemical mechanical polishing (CMP).

BACKGROUND OF THE INVENTION

Metallization interconnects are critical to the proper electronic function of semiconductor devices. Several advances in semiconductor processing have been aimed at improving signal transport speed by reducing metal interconnect resistivities and improving resistance to electromigration effects. Copper has increasingly become a metal of choice in, for example, upper levels of metallization in a multi-level semiconductor device due to its low resistivity and higher resistance to electromigration. Tungsten is still preferred for use in the lower metallization layers adjacent to the silicon substrate since it provides an effective diffusion barrier to metal diffusion from overlying metallization layers to react with the silicon substrate. Tungsten further has high resistance to electromigration and can effectively be used to fill high aspect ratio vias by chemical vapor deposition (CVD) processes.

A serious problem in tungsten plug formation according to prior art methods of using a dry etchback process to remove the tungsten metal above a feature level is that during the dry etchback etching process, relatively wide dimensioned semiconductor features exhibit anisotropic-like etching of the tungsten metal filling, leaving little or no tungsten in a major portion of the feature while leaving a portion of the tungsten covering the feature sidewalls. For example, typical tungsten feature openings are practically limited to a maximum width or diameter of the feature opening at about 1 micron with a tungsten layer about 8000 Angstroms to about 10000 Angstroms thick due to considerations of cost, deposition time, and etchback time. In addition, feature opening dimensions of greater than about 1 micron require a CMP method to planarize the surface above the feature opening following tungsten deposition since metal etchback methods tend to produce anisotropic-like etching that preferentially etches into the metal filling for larger dimensioned feature openings.

For example, referring to FIG. 1A, is shown a cross sectional side view of a portion a semiconductor device at a stage in manufacture showing etched openings, 12A and 12B, overlying a conductive areas e.g., 14A, 14B which overlies a semiconducting substrate 16A. The etched openings, 12A and 12B are formed in a dielectric insulating layer 16B and an adhesion layer, also referred to as a glue layer, 18A is blanket deposited to line the openings to improve the adhesion of subsequently deposited tungsten. A tungsten layer 18B is then blanket deposited over the adhesion layer 18A. According to a chemical vapor deposition (CVD) method conforming to the general outline of, for example, the relatively wider dimensioned feature, 12A. For example, feature 12A is a contact opening having a width dimension of about 2 microns.

Referring to FIG. 1B, a dry etchback process is used to etchback the tungsten layer 18B. As is apparent in FIG. 1B, for example, the etching of the relatively wider dimensioned feature 12A, experiences anisotropic etching where the center portion of the tungsten filling is removed while leaving a portion of the tungsten layer e.g., 18B covering the feature sidewalls. As a result, prior art dry etchback processes have not been successfully implemented to planarize relatively wide dimensioned metal filled features including tungsten filled features.

Therefore, there is a need in the semiconductor processing art to develop a method for a reliable metal etchback process to planarize metal filled semiconductor features, including tungsten filled semiconductor features.

It is therefore an object of the invention to provide a method for a reliable metal etchback process to planarize metal filled semiconductor features, including tungsten filled semiconductor features while overcoming other shortcomings of the prior art.

SUMMARY OF THE INVENTION

To achieve the foregoing and other objects, and in accordance with the purposes of the present invention, as embodied and broadly described herein, the present invention provides a method for a metal etchback process to form a metal filled semiconductor feature having improved planarity and electrical resistance.

In a first embodiment, the method includes providing a semiconductor wafer having a process surface including an etched opening lined with a refractory metal containing layer and having a blanket deposited metal layer substantially filling the etched opening; spin coating a spin on layer (SOL) selected from the group consisting of an organic resinous layer and a spin-on glass (SOG) layer over the metal layer; dry etching in a first etchback process to remove a first portion of the SOL layer to reveal a portion of the metal layer leaving a second portion of the SOL layer overlying the etched opening; dry etching in a second etchback process to remove the metal layer to reveal a portion of the refractory metal containing layer; and, removing the second portion of the SOL layer to form a substantially planar metal filled etched opening.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained by reference to formation of a tungsten filled semiconductor feature, it will be appreciated that the method of the present invention may be advantageously applied to the formation of any metal filled semiconductor feature where a metal etchback process is used to planarize or partially planarize the semiconductor surface above the metal filled feature level to achieve improved metal etchback planarization, especially in the case of relatively wide dimensioned feature openings. By the term "relatively wide dimensioned" is meant a semiconductor feature opening, for example, formed in a dielectric insulating material, having an opening dimension of greater than about 1 micron.

In a first embodiment, the method includes providing a semiconductor wafer including a dielectric insulating layer having etched openings lined with an adhesion layer formed according to a blanket deposition process and a metal layer deposited over the etched openings to form metal filled openings; spin-coating a spin-on layer (SOL) of one of organic resin or spin-on glass (SOG) over the metal layer; etching back the SOL to stop on the metal layer to form a self aligned etching mask overlying the metal filled openings; etching back the metal layer to stop on the adhesion layer; and, removing a remaining portion of the self aligned etching mask to leave a planarized metal filled opening feature.

Figure 2A:
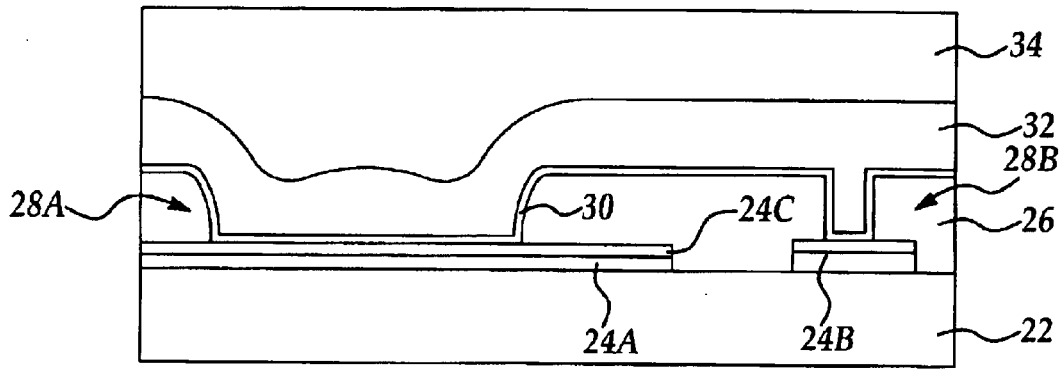
FIGS. 2A–2D are cross sectional side view representations of a portion of a semiconductor device at stages in manufacture according to the method of the present invention.

Referring to FIGS. 2A–2D, in an exemplary implementation including an exemplary embodiment are shown cross sectional views of a portion of a semiconductor device included in a process wafer at stages in a integrated circuit manufacturing process. Referring to FIG. 2A is shown a layer or substrate of semiconducting material 22, for example a doped silicon substrate, and having a patterned conductive layer e.g., 24A and 24B, formed thereover, for example, polysilicon formed over a gate oxide layer (not shown) to form a gate electrode structure. Preferably a polycide layer 24C, for example tungsten silicide layer (e.g., $WSi_x$ where x is about 2.2 to about 2.6) is formed over the polysilicon layer e.g., 24A prior to patterning the gate structures. It will be appreciated that other refractory silicides including, for example, tantalum silicide and molybdenum silicide may be suitably used to form the polycide layer e.g., 24C. Tungsten silicide is preferred however due to the relative ease of obtaining a high purity film by CVD deposition. For example the tungsten silicide is deposited by a LPCVD process at a temperature of about 300° C. to about 400°0 C. followed by an RTP process at about 900° C.

Still referring to FIG. 2A, following patterning of the gate structures an insulating dielectric layer 26, also referred to as an interlayer dielectric layer (ILD) is deposited to a thickness of about 6000 Angstroms to about 10,000 Angstroms. The ILD layer is deposited by a conventional CVD or PECVD process and is formed of silicon dioxide optionally doped with fluorine or carbon to reduce a dielectric constant. Following deposition of the ILD layer 26 the ILD layer is photolithographically patterned and anisotropically etched by conventional processes including, for example, a reactive ion etch (RIE) process including a fluorocarbon etching chemistry, to form etched openings e.g., 28A and 28B overlying the patterned polycide gate structures.

Still referring to FIG. 2A, an adhesion layer 30, also referred to as a glue layer is blanket deposited to line the etched openings 28A and 28B. Preferably, a titanium (Ti) containing layer 30, for example a first PVD deposited layer of titanium of about 20 Angstroms to about 50 Angstroms followed by a CVD deposited layer of titanium nitride (e.g., TiN) of about 100 Angstroms to about 200 Angstroms. The adhesion layer 30 is important to achieve improved adhesion of the subsequently formed overlying tungsten layer. It will be appreciated that other refractory metals or refractory nitrides, such as tungsten, tantalum or their nitrides may be used for the adhesion layer as well.

Following formation of the adhesion layer 30, a layer of tungsten 32 is deposited to fill the etched openings 28A and 28B. Preferably, a tungsten CVD process is used to blanket deposit the tungsten layer 32, for example, using hydrogen and/or silane reduction of $WF_6$ by a low pressure CVD (LPCVD) process carried out at about 350° C. to 450° C. For example, a first thin layer (e.g., 50 to 100 Angstroms) of tungsten may be deposited over the adhesion layer using silane reduction for improved nucleation followed by depositing the bulk of the tungsten according to a hydrogen reduction process for improved step coverage.

Figure 1A:
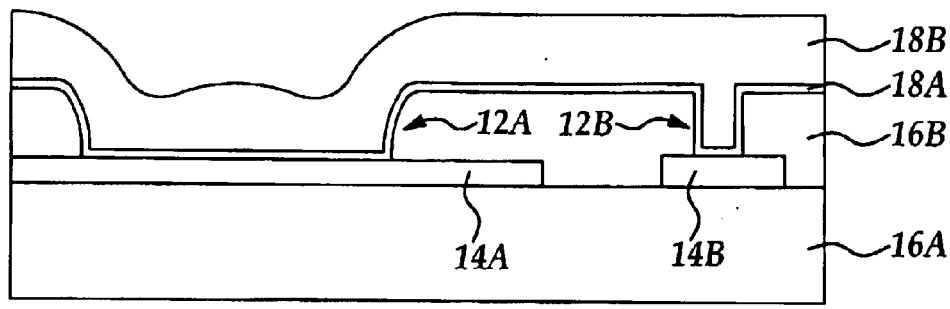
FIGS. 1A–1B are cross sectional side view representations of a portion of a semiconductor device at stages in manufacture according to the prior art.
Figure 1B:
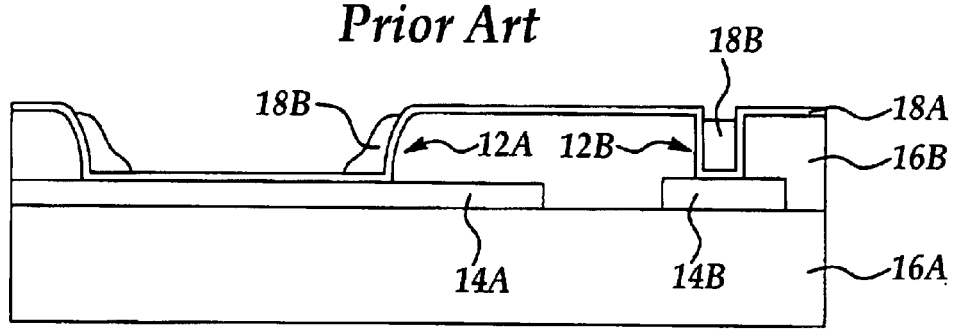

Still referring now to FIG. 1A, according to an aspect of the present invention, a spin-on layer (SOL) 34 of one of an organic resin or a spin-on glass (SOG) is formed over the tungsten layer 32. For example, a conventional Novolak resin including a conventional photoresist may be used for the SOL. More preferably, the SOL is a SOG, for example, including at least one of siloxanes, silicates, and silsesquioxanes. An SOG is preferably used for the SOL according to the present invention since it has superior etching resistance in a tungsten etchback process where sulfur hexafluoride ($SF_6$) is included in the etching chemistry. SOG's may be doped with conventional dopants such as $P_2O_5$ to decrease a dielectric constant or with alkyl groups such as methyl and phenyl groups at about 1 to about 12 weight percent carbon to increase a cracking resistance and to lower a dielectric constant. For example exemplary SOG's include $SiO_2$, polyarylene ether, hydrogen silesquioxane (HSQ) and methyl silsesquioxane (MSQ). The SOG's preferably undergo a conventional curing process to drive off solvents and stabilize the film following deposition. Preferably, the SOG layer is deposited at a thickness of about 300 Angstroms to about 1000 Angstroms thick.

Figure 2B:
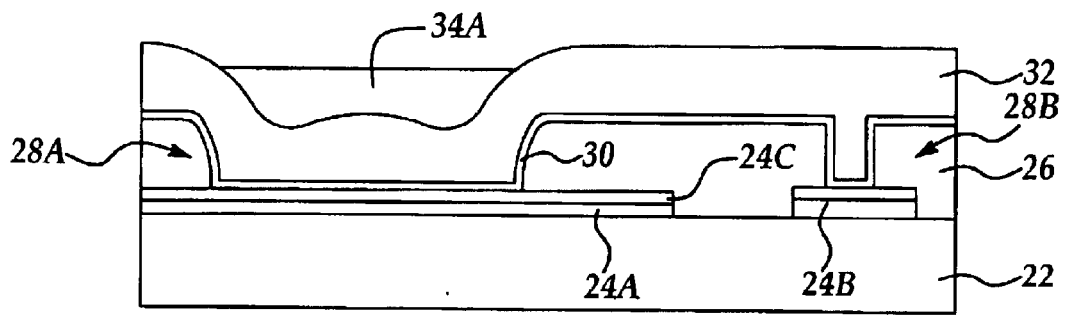

Referring to FIG. 2B, following deposition of the SOL 34, for example SOG or photoresist, the SOL 34 is etched back by a dry etching process to stop on the tungsten layer 32. Preferably, by stopping the dry etching process on the tungsten layer, a portion of the SOL layer e.g., 34A is left overlying the relatively wide dimensioned etched opening to form a self-aligned hard mask for a subsequent etching process. An important feature of the invention is that a photolithographic patterning step is not required to form the hard mask since it is self aligned according to spin-on blanket deposition process and the dry etchback process. For example, following the SOL etchback process, an SOL layer portion 34A remains overlying a recessed area over the relatively wide dimensioned opening 28A formed following the tungsten deposition process. The dry etchback process includes, in the case the SOL is a photoresist layer, a conventional oxygen containing oxygen ashing etching chemistry. In the case the SOL is a SOG, the dry etchback etching chemistry includes a conventional fluorocarbon etching chemistry.

Figure 2C:
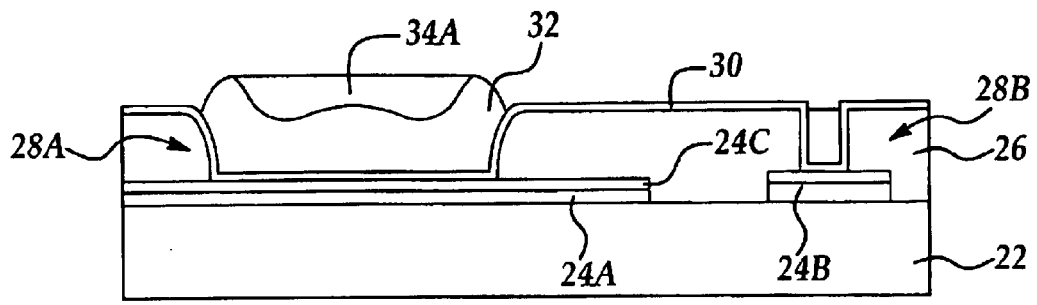

Referring to FIG. 2C, following the SOL etchback process, a tungsten etchback process including a conventional sulfur hexafluoride ($SF_6$) chemistry is used to stop on the adhesion layer 30, for example, revealing at least a portion of the adhesion layer 30. The self aligned mask portion of the SOL layer e.g., 34A overlying the relatively wider dimensioned feature, 28A acts as an etching mask to protect the underlying tungsten during the tungsten etchback process to leave a tungsten layer portion substantially coplanar with the adhesion layer 30.

Figure 2D:
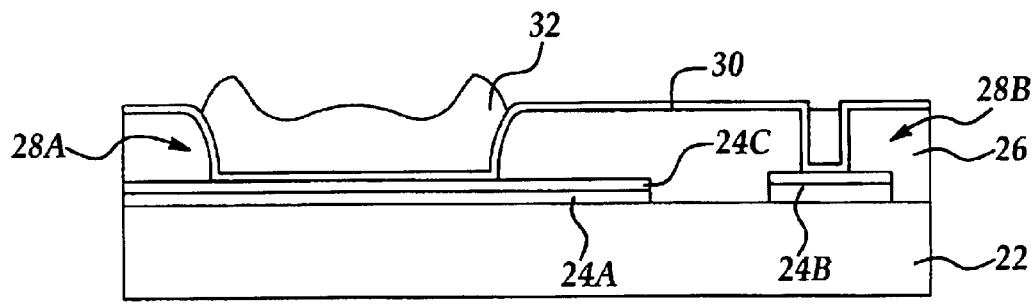

Referring now to FIG. 2D, following the tungsten etchback process, the remaining portion of the SOL layer (self-aligned etching mask) overlying the tungsten layer filling the etched opening, e.g., 28A is removed (stripped). Preferably, the remaining portion of the SOL layer is removed by a dry etching process, using a similar etching chemistry for the SOL etchback process, for example an oxygen ashing process in the case the SOL layer is a photoresist material. In the case the SOG is a SOG, preferably a carbon-tetra-fluoride ($CF_4$) containing etching chemistry is used. Following the SOL stripping process a substantially planar etchback surface with a substantially tungsten filled opening is formed thereby improving a subsequent photolithographic patterning process. By the term 'substantially' is meant a value within about plus or minus 10 percent of the stated condition.

Thus, according to the present invention, a method for providing a metal etchback process, for example tungsten, has been developed whereby an etchback surface with improved planarity is produced, especially the case where the feature opening dimension is greater than about 1 microns, the process achieving even greater advantages for feature opening dimensions greater than about 2 microns. An added advantage of using relatively wide dimensioned contact openings, for example, 28A, with improved planarity according to an aspect of the present invention is that the overall electrical resistance is decreased relative to multiple small dimensioned contact plugs (metal filled opening) due to the inverse proportionality of resistance to area.

Figure 3:
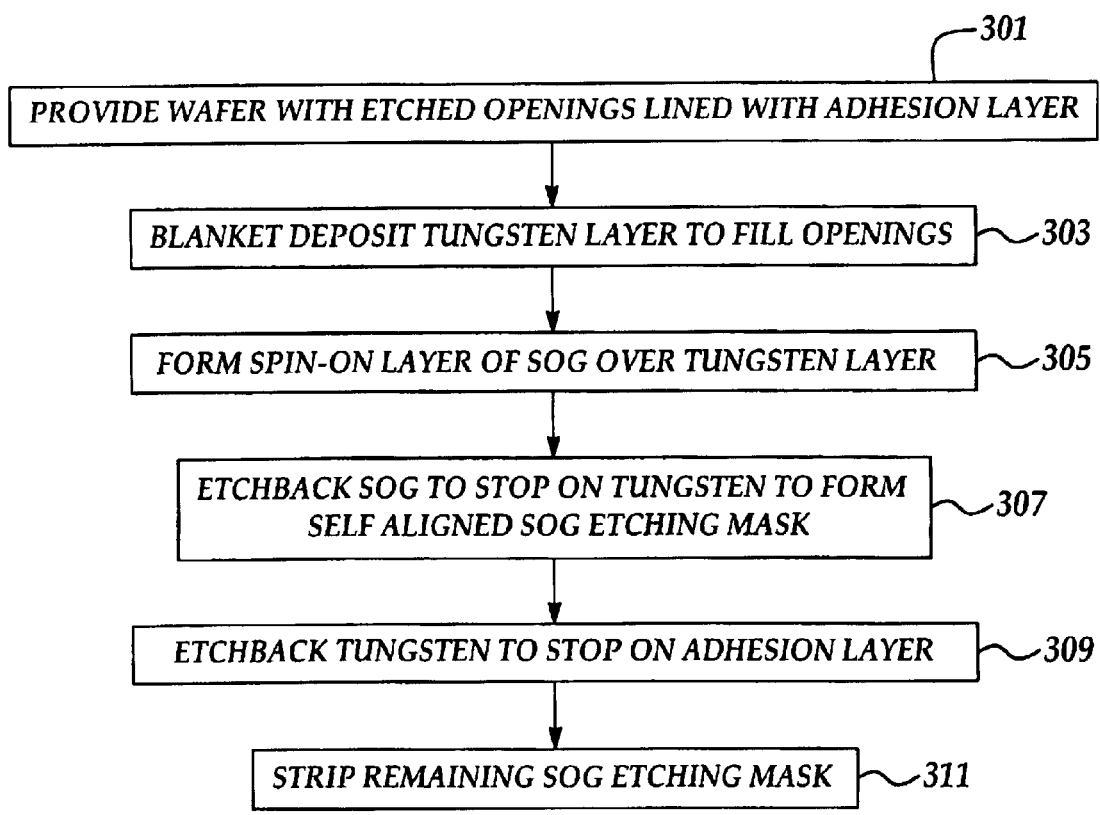
FIG. 3 is a process flow diagram including several embodiments of the present invention.

Referring to FIG. 3 is a process flow diagram including several embodiments of the present invention. In process 301, etched feature openings formed in a dielectric insulating layer and lined with a blanket deposited adhesion layer are provided. In process 303, a tungsten layer is blanket deposited over the etched openings to form tungsten filled openings. In process 305, an SOG layer is blanket deposited over the tungsten layer. In process 307, an SOG etchback process, for example a dry etchback process including a fluorocarbon etching chemistry is carried out to stop on the tungsten layer leaving a portion of the SOG layer overlying the tungsten filled openings to form a self aligned etching mask. In process 309, a tungsten etchback process is carried out to stop on the adhesion layer. In process 311, a remaining portion of the SOG layer forming the self aligned etching mask is removed or stripped, for example by a dry etchback process including carbon-tetra-fluoride as an etching chemistry.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for a metal etchback process to form a metal filled semiconductor feature having improve planarity and electrical resistance comprising the steps of:

providing a semiconductor wafer having a process surface comprising an etched opening lined with a refractory metal containing layer and having a blanket deposited metal layer substantially filling the etched opening;

spin coating a spin on layer (SOL) over the metal layer;

a first etchback process to remove a first portion of the SOL layer to reveal a portion of the metal layer leaving a second portion of the SOL layer overlying the etched opening;

a second etchback process to remove the metal layer to reveal a portion of the refractory metal containing layer; and, removing the second portion of the SOL layer to form a substantially planar metal filled etched opening.

2. The method of claim 1, wherein the refractory metal containing layer is an adhesion layer comprising titanium nitride (TiN).

3. The method of claim 1, wherein the etched openings are formed in a dielectric insulating layer in closed communication with an underlying polycide layer.

4. The method of claim 1, wherein the metal layer comprises chemical vapor deposited (CVD) tungsten.

5. The method of claim 1, wherein the SOL comprises a photoresist.

6. The method of claim 1, wherein the SOG layer comprises at least one of siloxanes, silicates, and silsesquioxanes.

7. The method of claim 1, wherein the first etchback process stops on the metal layer to form a self aligned etching mask.

8. The method of claim 7, wherein the second etchback process stops on the refractory metal containing layer.

9. The method of claim 1, wherein the step of stripping comprises a dry etching process including an oxygen containing plasma for removing the SOL.

10. The method of claim 1, wherein the step of stripping comprises a dry etching process including a carbon-tetra-fluoride ($CF_4$) containing plasma for removing the SOG layer.

11. A method for a tungsten etchback process to form a tungsten metal containing filled semiconductor feature having improved planarity and electrical resistance comprising the steps of:

providing a semiconductor wafer having a process surface comprising an etched opening lined with an adhesion layer and having a blanket deposited tungsten containing layer substantially filling the etched opening;

spin coating a spin-on layer comprising a spin-on glass (SOG) layer over the tungsten containing layer;

dry etching in a first etchback process to remove a portion of the SOG layer to stop on the tungsten containing layer leaving a self aligned SOG portion forming an etching mask overlying the etched openings;

dry etching in a second etchback process to remove a portion of the tungsten containing layer to stop on the adhesion layer; and, removing a remaining portion of the self aligned SOG portion to form a tungsten containing layer substantially filling the etched openings and substantially coplanar with the adhesion layer.

12. The method of claim 11, wherein the adhesion layer comprises at least one of a refractory metal and refractory metal nitride.

13. The method of claim 12, wherein the refractory metal and refractory metal nitride includes at least one of titanium (Ti), tungsten (W), and tantalum (Ta).

14. The method of claim 11, wherein the etched opening is formed in a dielectric insulating layer in closed communication with an underlying polycide layer.

15. The method of claim 11, wherein the tungsten containing layer is formed by a chemical vapor deposition (CVD) method.

16. The method of claim 11, wherein the SOG layer comprises at least one of siloxanes, silicates, and silsesquioxanes.

17. The method of claim 11, wherein the step of stripping comprises a dry etching process including a carbon-tetra-fluoride ($CF_4$) containing plasma for removing the self aligned SOG portion.

18. The method of claim 11, wherein the etched opening is formed with an opening diameter greater than about 1 micron.

19. The method of claim 18, wherein the etched openings is formed with an opening diameter greater than about 2 microns.

* * * * *